(12) United States Patent
Huang et al.

(10) Patent No.: US 11,486,652 B2
(45) Date of Patent: Nov. 1, 2022

(54) THERMOSYPHON HEAT SINK

(71) Applicant: DELTA ELECTRONICS, INC., Taoyuan (TW)

(72) Inventors: Yu-Hung Huang, Taoyuan (TW); Li-Kuang Tan, Taoyuan (TW); Wei-Fang Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 197 days.

(21) Appl. No.: 16/513,325

(22) Filed: Jul. 16, 2019

(65) Prior Publication Data
US 2019/0339023 A1 Nov. 7, 2019

Related U.S. Application Data

(63) Continuation of application No. 14/145,223, filed on Dec. 31, 2013, now abandoned.

(51) Int. Cl.
*F28D 15/04* (2006.01)

(52) U.S. Cl.
CPC ........... *F28D 15/046* (2013.01); *F28D 15/04* (2013.01); *H01L 2924/0002* (2013.01)

(58) Field of Classification Search
CPC .... F28D 15/04; F28D 15/046; F28D 15/0233; F28D 15/0266; F28D 2015/0225; F28D 15/025; H01L 23/427
USPC .............. 165/104.26, 104.21, 80.3; 361/700; 257/715
See application file for complete search history.

(56) References Cited

U.S. PATENT DOCUMENTS

| | | | | |
|---|---|---|---|---|
| 3,958,627 A | * | 5/1976 | Edelstein | F28D 15/06 165/273 |
| 4,020,898 A | * | 5/1977 | Grover | F28D 15/04 165/104.26 |
| 4,058,159 A | * | 11/1977 | Iriarte | F28D 15/046 165/104.26 |
| 4,351,388 A | * | 9/1982 | Calhoun | F28D 15/046 165/104.26 |
| 4,441,548 A | * | 4/1984 | Franklin | F28D 15/046 165/104.26 |
| 4,463,798 A | * | 8/1984 | Pogson | F28D 15/0241 165/104.23 |

(Continued)

FOREIGN PATENT DOCUMENTS

| | | |
|---|---|---|
| JP | 03117889 | 5/1991 |
| JP | 03117890 | 5/1991 |

(Continued)

*Primary Examiner* — Jianying C Atkisson
*Assistant Examiner* — For K Ling
(74) *Attorney, Agent, or Firm* — Hauptman Ham, LLP

(57) ABSTRACT

A heat-dissipating device includes a condenser and an evaporator. The condenser includes a shell and a main capillary wick. The shell has a chamber and a through hole communicating with the chamber. The main capillary wick is disposed in the chamber. The evaporator has an evaporating section, a gas conduit and a liquid conduit. The evaporating section has a gas cavity, and the liquid conduit communicating with the chamber and filling with a liquid. The liquid conduit having a hole communicating with the gas cavity is inserted in the gas conduit and the gas cavity. A stepped area is formed between the liquid conduit and the chamber for gathering the liquid flowing into the liquid conduit.

18 Claims, 18 Drawing Sheets

(56) References Cited

U.S. PATENT DOCUMENTS

| | | | | |
|---|---|---|---|---|
| 4,640,347 A * | 2/1987 | Grover | ............... | F28D 15/0233 165/104.21 |
| 4,815,258 A * | 3/1989 | Jesperson | ............. | B65B 25/046 53/245 |
| 4,890,668 A * | 1/1990 | Cima | ................... | F28D 15/043 165/104.25 |
| 5,056,592 A * | 10/1991 | Larinoff | ................... | F28B 1/06 165/111 |
| 5,076,351 A * | 12/1991 | Munekawa | ......... | F28D 15/0283 165/104.21 |
| 5,725,049 A * | 3/1998 | Swanson | ............... | F28D 15/043 122/366 |
| 6,105,662 A * | 8/2000 | Suzuki | ............... | F28D 15/0241 165/104.33 |
| 6,257,324 B1 * | 7/2001 | Osakabe | ............ | F28D 15/0266 165/104.33 |
| 6,827,134 B1 * | 12/2004 | Rightley | ............. | F28D 15/0233 165/104.21 |
| 6,840,310 B2 * | 1/2005 | Tonosaki | ............ | F28D 15/0266 165/104.21 |
| 6,840,311 B2 * | 1/2005 | Ghosh | ................ | F28D 15/0233 165/104.33 |
| 6,880,624 B1 * | 4/2005 | Pinneo | ................... | F28D 15/02 165/104.21 |
| 6,880,626 B2 * | 4/2005 | Lindemuth | ............. | B22F 7/004 165/104.26 |
| 6,981,543 B2 * | 1/2006 | Chesser | ................ | F28D 15/043 165/104.13 |
| 7,007,746 B2 * | 3/2006 | Wu | ....................... | F28D 15/043 165/104.26 |
| 7,246,655 B2 * | 7/2007 | Mochizuki | ............ | F28D 15/046 165/104.21 |
| 7,652,885 B2 * | 1/2010 | Tomioka | ................. | G06F 1/203 361/700 |
| 7,775,262 B2 * | 8/2010 | Liu | ....................... | H01L 23/427 165/104.26 |
| 8,919,427 B2 * | 12/2014 | Wang | .................... | F28D 15/046 165/104.26 |
| 2007/0246193 A1 * | 10/2007 | Bhatti | .................. | H01L 23/427 165/104.21 |
| 2007/0295485 A1 * | 12/2007 | Liu | ....................... | F28D 15/046 165/104.26 |
| 2009/0025907 A1 * | 1/2009 | Wenger | ............... | F28D 15/0266 165/80.3 |
| 2010/0243212 A1 * | 9/2010 | Meyer, IV | .............. | F28D 15/04 165/104.26 |
| 2011/0067844 A1 * | 3/2011 | Meyer, IV | ......... | F28D 15/0233 165/104.26 |
| 2011/0232874 A1 * | 9/2011 | Xu | ....................... | F28D 15/0266 165/104.21 |
| 2011/0232877 A1 * | 9/2011 | Meyer, IV | ......... | F28D 15/0266 165/104.26 |
| 2012/0268877 A1 | 10/2012 | Rice | | |

FOREIGN PATENT DOCUMENTS

| | | | | |
|---|---|---|---|---|
| JP | 03156294 A | * | 7/1991 | ......... F28D 15/0283 |
| JP | 03156291 A | * | 10/1991 | ........... F28D 15/046 |
| JP | 2001116474 | | 4/2001 | |
| JP | 2001116474 A | * | 10/2001 | .............. F28F 13/06 |
| TW | I339331 | | 8/2008 | |

* cited by examiner

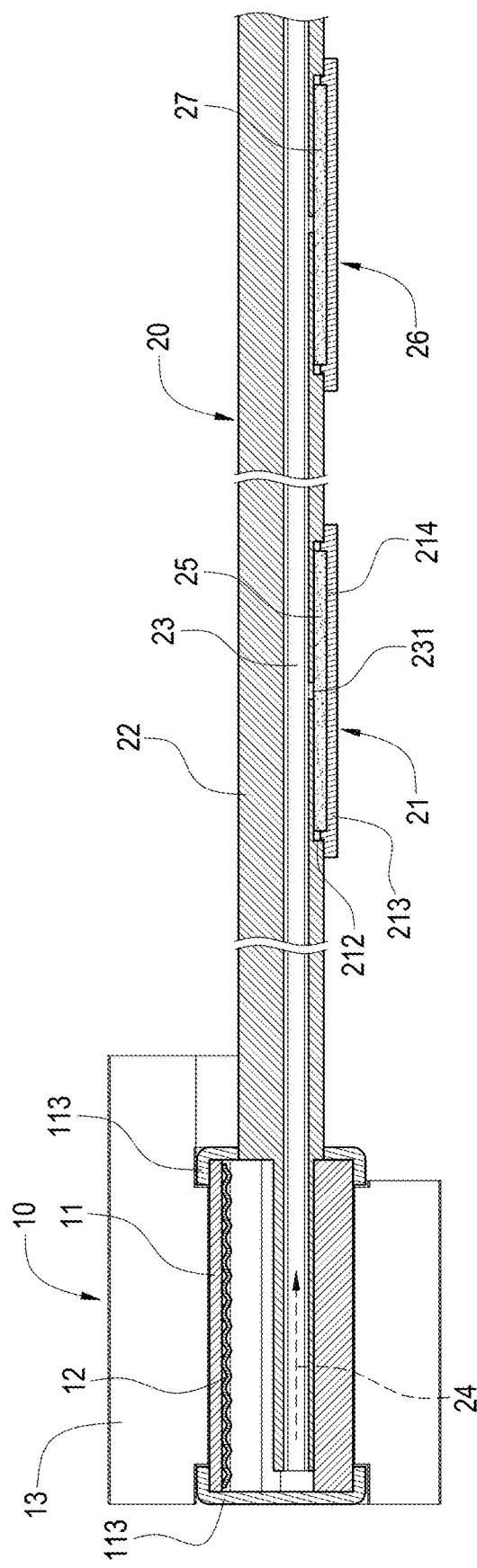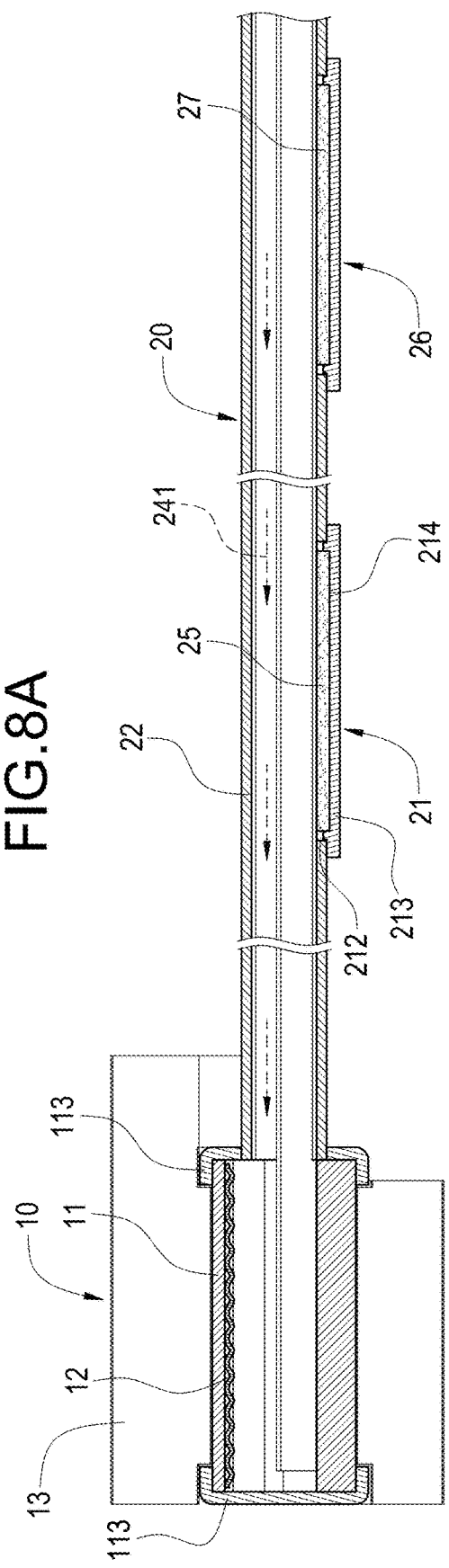
FIG.8A
FIG.8B

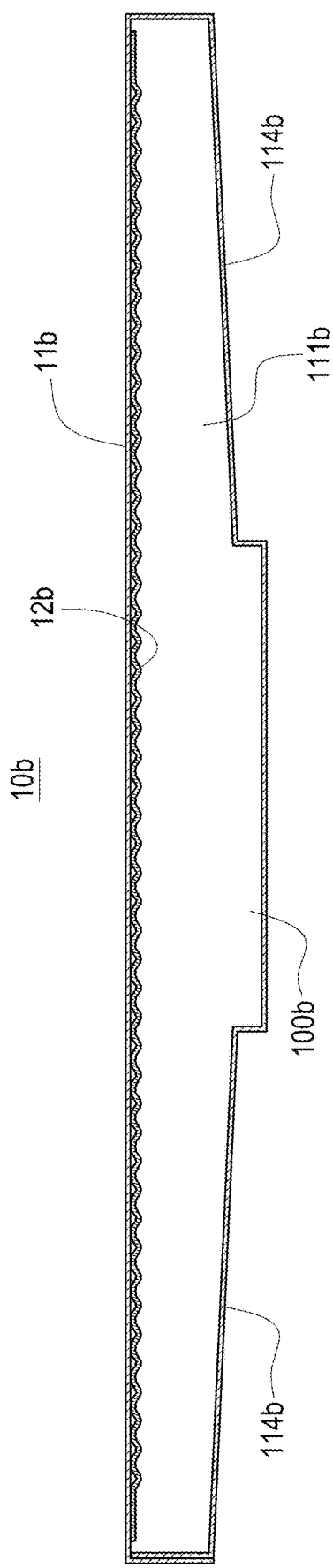
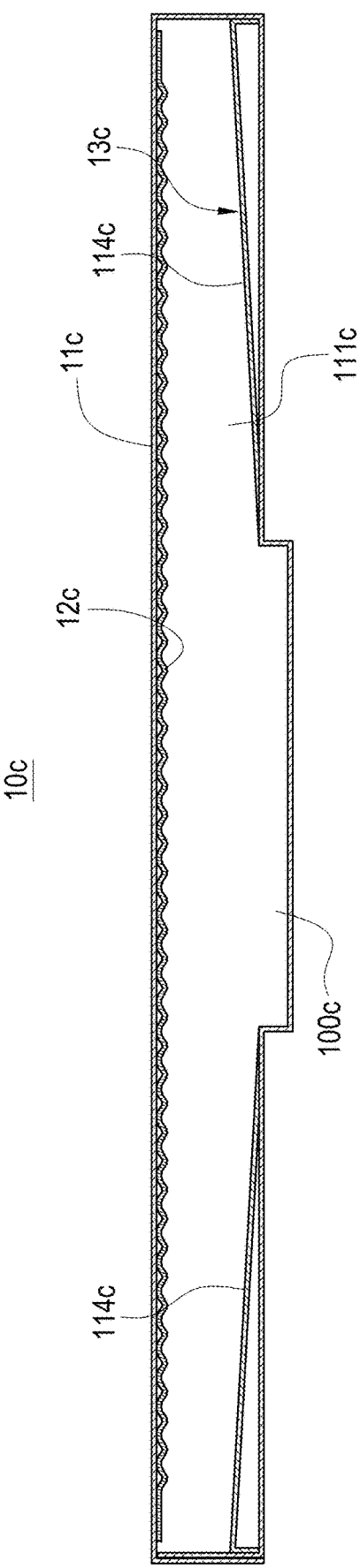
FIG.12
FIG.13

THERMOSYPHON HEAT SINK

CROSS-REFERENCE TO RELATED APPLICATION

This application is a continuing application of U.S. patent application Ser. No. 14/145,223, filed on Dec. 31, 2013, and entitled "THERMOSYPHON HEAT SINK", which claims priority to CN201310560527.5 filed Nov. 12, 2013. The entire disclosures of the above application are all incorporated herein by reference.

BACKGROUND OF THE INVENTION

Field of the Invention

The present invention generally relates to a heat-dissipating device and, in particular to a thermosyphon heat sink.

Description of Prior Art

Generally speaking, electronic components or semiconductor of electronic products or optoelectronic products generate a large amount of heat during operation. The electronic components or semiconductor should be prevented from overheating and causing damages to electronic products or optoelectronic products. The electronic products or optoelectronic products will be out of function due to overheating. Thus heat dissipating devices are usually used for cooling electronic components or semiconductor of electronic products or optoelectronic products.

Taking Taiwanese patent No. I339331 as an example, the conventional thermosyphon heat sink includes an evaporator, a condenser, a gas tube, a liquid tube and a working fluid. Two ends of the gas tube are connected with the evaporator and the condenser respectively. The liquid tube is connected with the evaporator and the condenser respectively. One side of the evaporator is contacted with the heating element, and the working fluid is filled in the evaporator. When using, the heat generated from the heating element can be conducted to the working fluid through the evaporator. The working fluid absorbs the heat and is transformed into the gas, and the gas will flow into the condenser through the gas tube. The liquid will flow into the evaporator through the liquid tube after being cooled in the condenser to achieve the cooling circulation effect.

However, the conventional thermosyphon heat sink has the following shortcomings:

(1) A path of gas flowing into the condenser from the evaporator through the gas tube and a path of gas flowing into the evaporator from the condenser are too long so that the fluid resistance is large and the circulation speed of the liquid and the gas is slow. As a result, the effect of heat dissipating is poor.

(2) The condenser is composed of a plurality of flat tubes, gas-gathering tubes and liquid gathering tubes so that the volume of the heat sink is large and the manufacturing process is complicated. As a result, the cost of the manufacturing process and the material will be increased.

SUMMARY OF THE INVENTION

Accordingly, an object of the present invention is to provide a heat-dissipating device, wherein a stepped area is formed at a location where the liquid conduit is assembled with the chamber for gathering the liquid reflowing to the evaporating section after condensing, thereby the heat of the heating element will be absorbed continuously.

In order to achieve the object mentioned above, the present invention provides a heat-dissipating device for contacting with a heating element. The heat-dissipating device includes a condenser and an evaporator. The condenser includes a shell and a main capillary wick. The shell has a chamber and a through hole communicating with the chamber, and the main capillary wick is disposed in the chamber. The evaporator includes an evaporating section having a gas cavity, a gas conduit communicating with the through hole, and a liquid conduit communicating with the chamber and filling with working fluid. The liquid conduit is inserted in the gas conduit and has a hole communicating with the gas cavity, and an outer surface of the evaporating section is contacted with the heating element; wherein a stepped area is formed at a location where the liquid conduit is assembled with the chamber, the liquid flows in the gas cavity and absorbs the heat generated from the heating element to be transformed into gas to flow in the chamber through the gas conduit, and the gas is transformed into the liquid and gathered in the stepped area by cooling the condenser for flowing in the liquid conduit.

The present invention has the following effects. The liquid flows in the liquid conduit, and the gas flows in the gas conduit for achieving a flowing diversion effect. The liquid can be avoided from an affection of the gas when reflowing into the evaporating section, then a flowing resistance of the liquid and the gas can be reduced. The circulation speed of the liquid and the gas will be raised for a better heat dissipating effect of the heat sink.

Because a cross section of the liquid conduit is smaller than a cross section of the gas conduit, an auto flowing diversion effect can be achieved by the principle of pressure difference for the liquid flowing into the liquid conduit and the gas flowing into the gas conduit.

Further, the auxiliary evaporating section and the evaporating section are arranged in a line or disposed in a staggered manner; therefore, cooling for a plurality of heating elements at the same time can be achieved. Moreover, when the gas in the condenser is cooled and transformed into liquid, the liquid can flow quickly into the liquid conduit by an inclined plane of the chamber of the shell because of gravity. Thus, the cooling circulation of the liquid and the gas can be enhanced for a better cooling effect of the heat sink. Furthermore, a stepped area is formed at a location where the liquid conduit is assembled with the chamber for gathering the liquid reflow to the evaporating section after cooling. Thus, the effect for absorbing the heat generated from the heating element continuously is achieved.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

FIG. 8A is a schematic diagram of the first embodiment of the heat-dissipating device of the present invention while operating;

FIG. 8B is another schematic diagram of the first embodiment of the heat-dissipating device of the present invention while operating;

FIG. 12 shows another type of the condenser of the heat-dissipating device of the present invention;

FIG. 13 shows further another type of the condenser of the heat-dissipating device of the present invention;

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Please refer to FIG. 1 to FIG. 4 showing the first embodiment of the heat-dissipating device of the present invention. The present invention provides a heat-dissipating device or thermosyphon heat sink 1 for contacting with a heating element. The heat-dissipating device 1 includes a condenser 10 and an evaporator 20.

Figure 1:
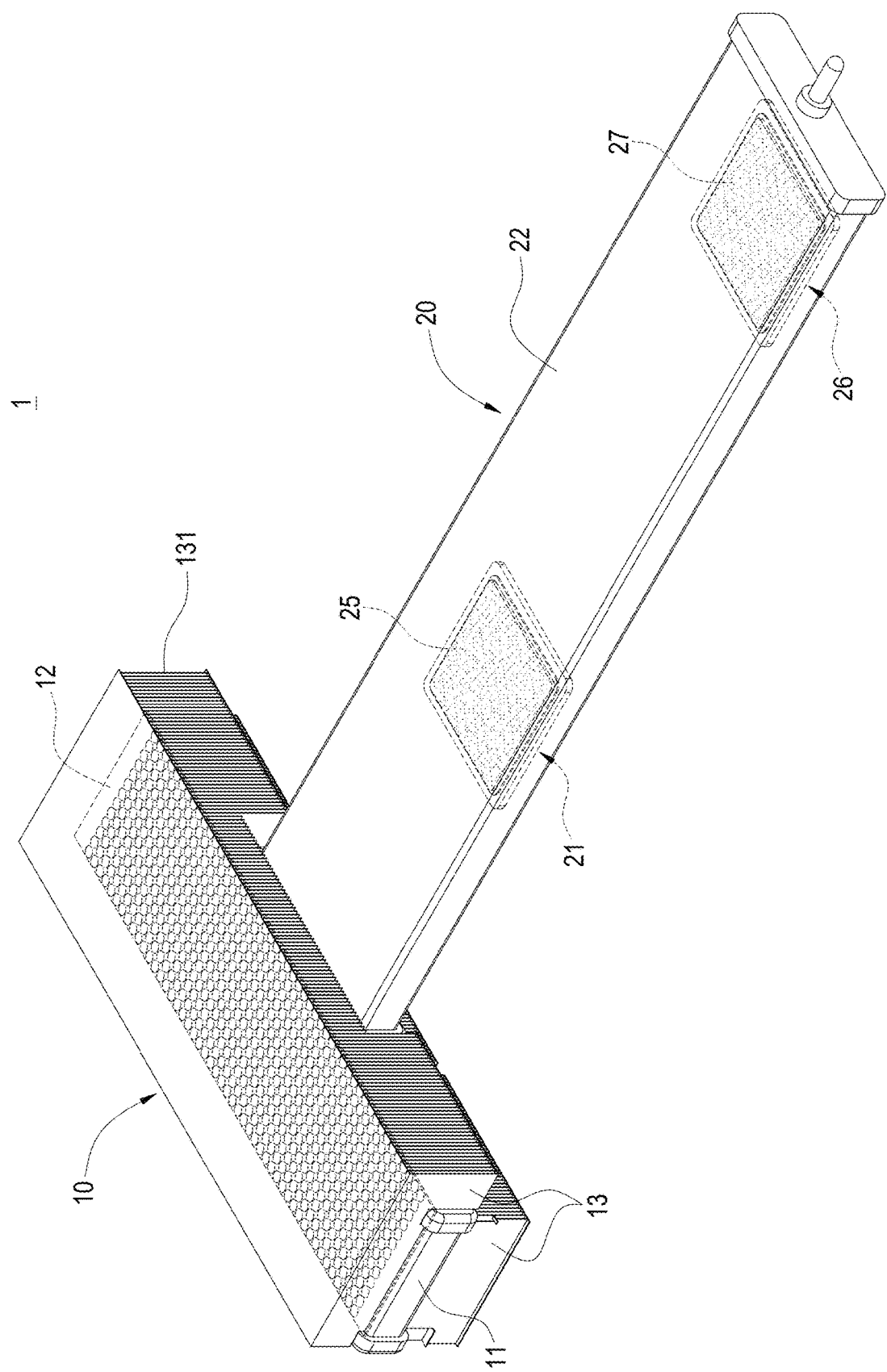
FIG. 1 is a perspective view of the first embodiment of the heat-dissipating device of the present invention.
Figure 2:
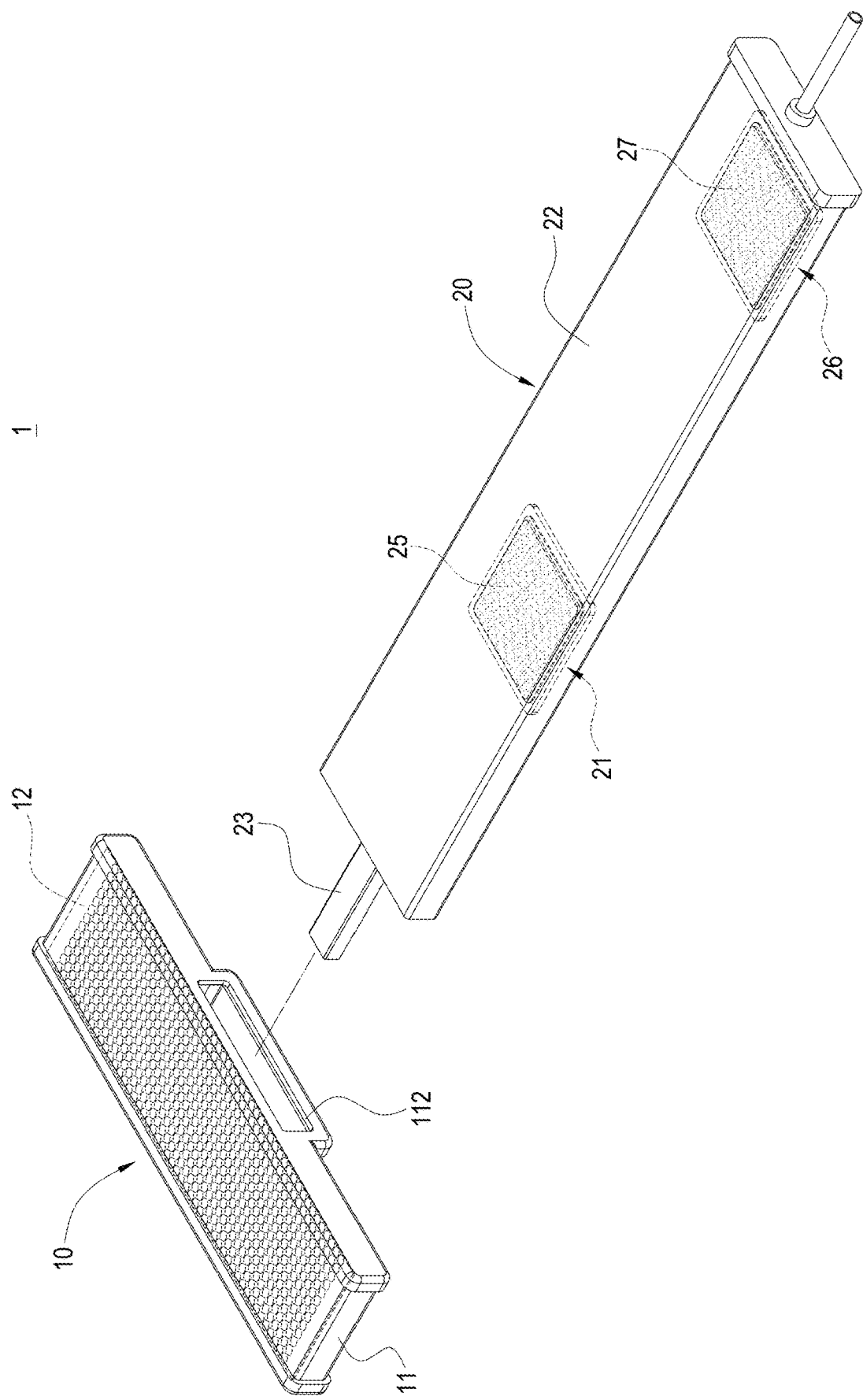
FIG. 2 is a partially exploded view of the first embodiment of the heat-dissipating device of the present invention.
Figure 3:
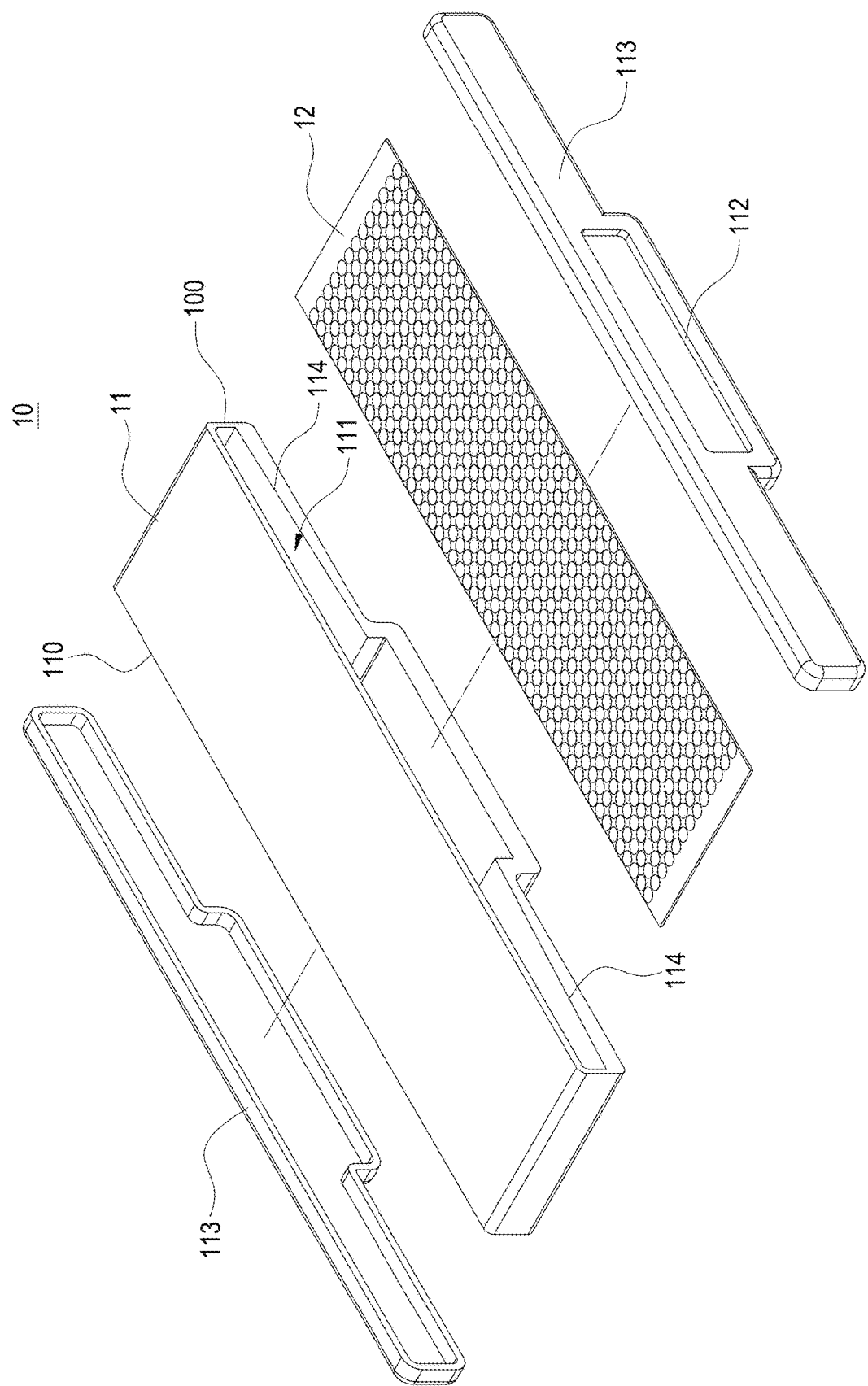
FIG. 3 is an exploded view of the condenser of the first embodiment of the present invention.

As shown in FIGS. 1-3, the condenser 10 includes a shell 11, a main capillary wick 12 and a heat-dissipating body 13. The shell 11 has a chamber 111 and a through hole 112. The through hole 112 communicating with the chamber 111 is provided at one side of the shell 11. The main capillary wick 12 is disposed in the chamber 111. The main capillary wick 12 can be a metal net or a plurality of heat-dissipating fins, or disposed on an inner surface of the chamber 111 by sintering of metal powder or sand blasting. Alternatively, the main capillary wick 12 can be disposed at the inner wall of the chamber 111 and constituted by a foam material. Moreover, the main capillary wick 12 can also be configured in a wavy shape or provided as heat-dissipating fins. The heat dissipating bodies 13 are disposed on two opposite ends outside the shell 11, and the heat-dissipating bodies 13 includes a plurality of heat-dissipating fins 131 arranged at intervals.

As shown in FIG. 3, the condenser 10 further includes a couple of lids 113. A couple of entrances 110 communicating with the chamber 111 are disposed respectively at a front end and a back end of the shell 11. Each lid 113 covers and seals the entrance 110. The through hole 112 is disposed on one of the lids 113, and the through hole 112 is communicated with the chamber 111. Thus, the shell 11 can be formed by extruding for facilitating the manufacturing process of the shell 11 and saving the manufacturing cost. Moreover, two sides of the bottom of the chamber 111 are formed with an inclined plane 114 respectively in a direction from an end of the lid 113 tilting toward the through hole 112; therefore, the wall thickness of the shell 11 is not equal.

Figure 4:
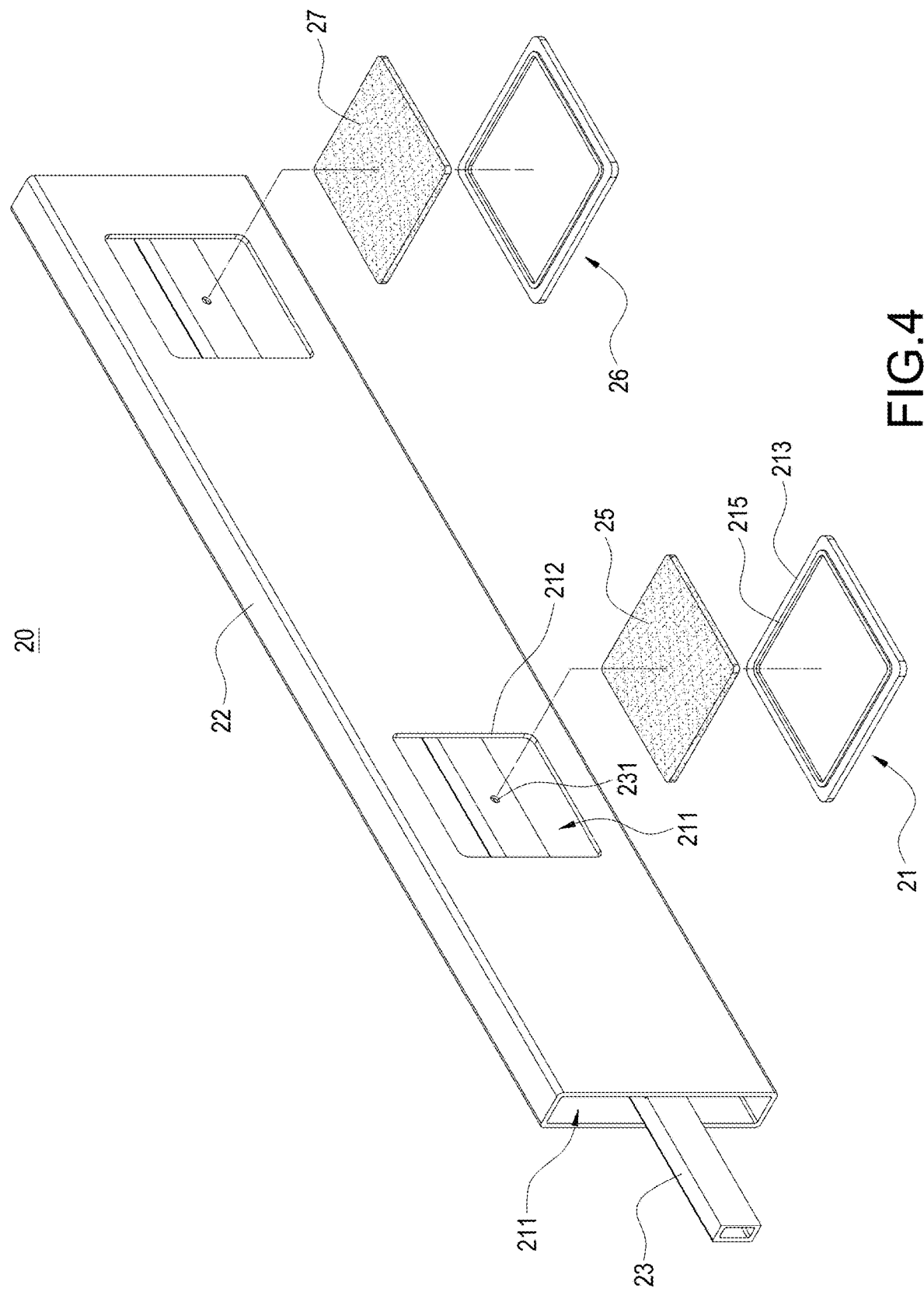
FIG. 4 is a partially exploded view of the evaporator of the first embodiment of the heat-dissipating device of the present invention.
Figure 5:
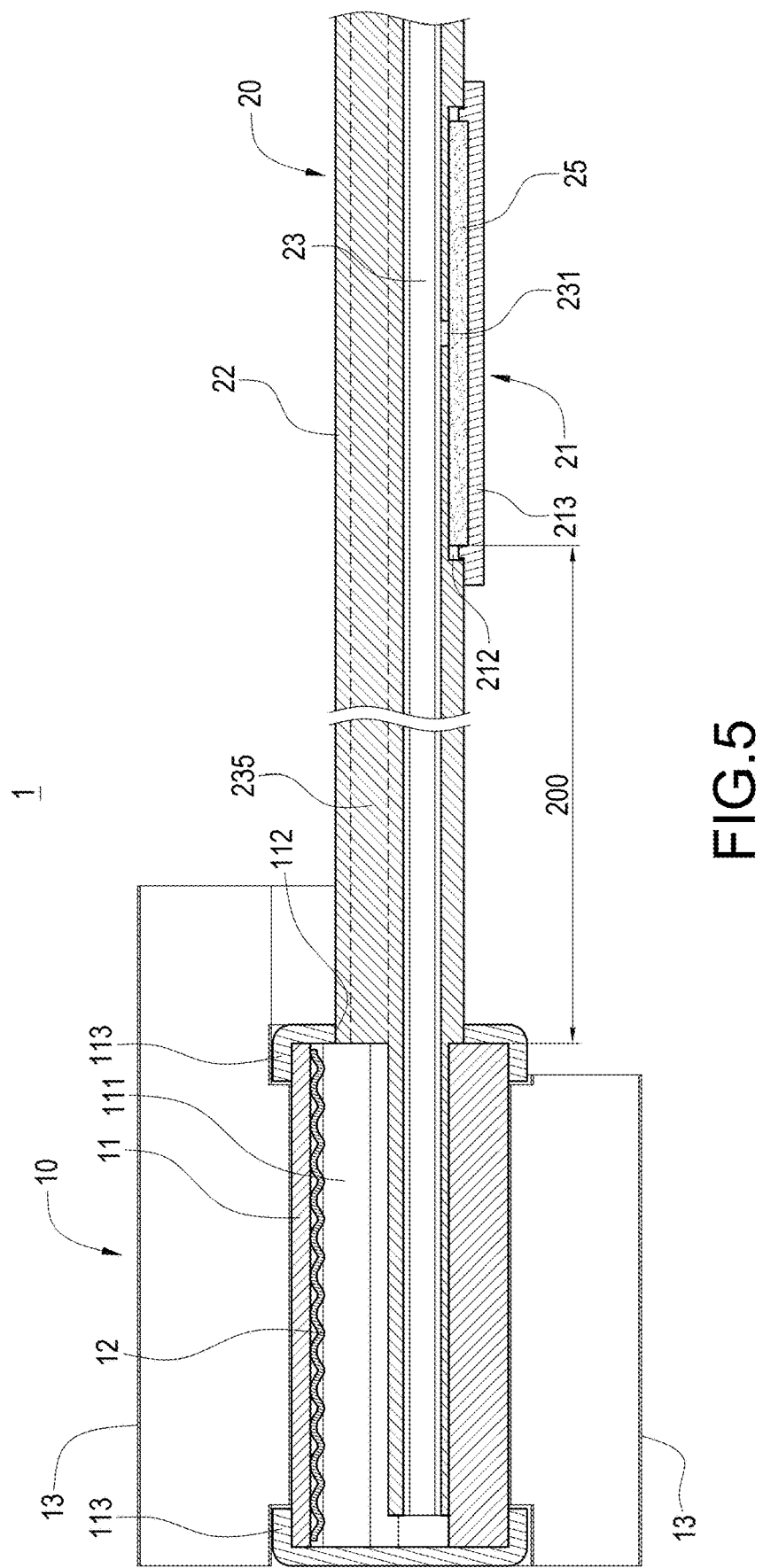
FIG. 5 is a cross-sectional view of the first embodiment of the heat-dissipating device of the present invention after being assembled.
Figure 6:
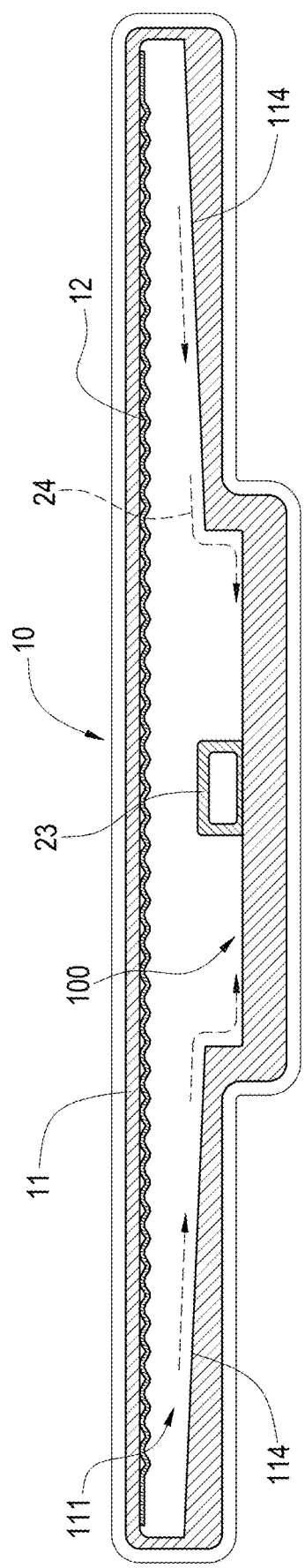
FIG. 6 is a partially cross-sectional view of the condenser of the first embodiment of the heat-dissipating device of the present invention.

As shown in FIG. 4, the evaporator 20 includes an evaporating section 21, a gas conduit 22, a liquid conduit 23, working fluid and an auxiliary capillary wick 25. An outer surface of the evaporating section 21 is connected with the heating element, and the gas conduit 22 is communicated with the through hole 112 at an end near the condenser 10. The evaporating section 21 has a gas cavity 211 communicating with the through hole 112, and the liquid conduit 23 communicating with the chamber 111 is filled with the working fluid. The working fluid can be, but not limited to, refrigerant or water etc.

The gas conduit 22 and the liquid conduit 23 are, for example but not limited to, long elongated tubes. One side of the evaporating section 21 has an opening 212 and a cover 213 corresponding to the opening 212. The opening 212 is communicated with the gas cavity 211, and the cover 213 is formed with an embedding slot 215 on a side near the gas cavity 211, and the cover 213 contacts with the heating element at a side away from the through hole 212. Moreover, the liquid conduit 23 is inserted in the gas conduit 22 and disposed in the gas cavity 211, and the gas conduit 22 has a hole 231 communicating with the gas cavity 211. Preferably, a cross section of the gas conduit 22 is larger than that of the liquid conduit 23. It is worthy to note that, one end of the liquid conduit 23 is protruded from the end where the gas conduit 22 communicating with the through hole 112 to be disposed in the chamber 111.

The auxiliary capillary wick 25 is disposed in the gas cavity 211 of the evaporating section 21, and one side of the auxiliary capillary wick 25 is connected with the embedding slot 215. The auxiliary capillary wick 25 can be a metal net or foam material disposed in the embedding slot 215, or formed by a plurality of heat-dissipating fins or in the embedding slot 215 by sand blasting.

In this embodiment, the evaporator 20 further includes an auxiliary evaporating section 26 at a side of the evaporating section 21 away from the condenser 10. The auxiliary evaporating section 26 and the evaporating section 21 are, but not limited to, in linear arrangement. The auxiliary evaporating section 26 further includes an auxiliary capillary wick 27. The gas conduit 22 and the liquid conduit 23 are extended to the auxiliary evaporating section 26. In real practice, the auxiliary evaporating section 26 and the evaporating section 21 can be disposed in a staggered manner for cooling heating elements 9 in different positions to achieve the heat dissipation effect.

Please also refer to FIG. 5 to FIG. 8C showing the condenser and the evaporator of the heat-dissipating device. The liquid conduit 23 is inserted in the gas conduit 22 and disposed in the gas cavity 211. Besides, one end of the liquid conduit 23 near the condenser 10 is extended and inserted in the chamber 111. Please refer to FIG. 5, it should be noted that there is a distance 200 between the through hole 112 and the auxiliary capillary wick 25, and the liquid conduit 23 and gas conduit 22 are not communicated in the distance 200. That is, the liquid and gas are totally separated in the distance 200, thus the circulation of heat dissipation is better in the distance 200.

A stepped area 100 (refer to FIG. 6) is formed in a location where the liquid conduit 23 is assembled in the chamber 111. The liquid 24 flows in the gas cavity 211 through the hole 231, and the liquid 24 is transformed into gas 241 by heat generated from the heating element in the gas cavity 211 and absorbed by the evaporating section 21. The gas 241 flows to the chamber 111 through the gas conduit 22 and the gas 241 is transformed into the liquid 24 and gathered in the stepped area 100 by cooling the condenser 10 so that the liquid 24 flows into the liquid conduit 23.

In this embodiment, the stepped area 100 is formed in an inner surface of the chamber 111 and located at a bottom of the main capillary wick 12 correspondingly. The liquid conduit 23 is disposed in the stepped area 100. Preferably, the stepped area 100 is located at the bottom of the center of the chamber 111 and formed as a storage space in the chamber 111. Thus the liquid 24 is gathered in the chamber 111. When the gas 241 in the condenser 10 is cooled and transformed into the liquid 24, the liquid 24 can flow quickly from two sides of the bottom of the inner surface into the middle portion of the bottom of the chamber 11 by the gravity. Thus, the liquid 24 can flow into the liquid conduit 23 quickly, and the cooling circulation of the heat-dissipating device 1 will be enhanced for improving the cooling effect of the heat-dissipating device 1.

Figure 7:
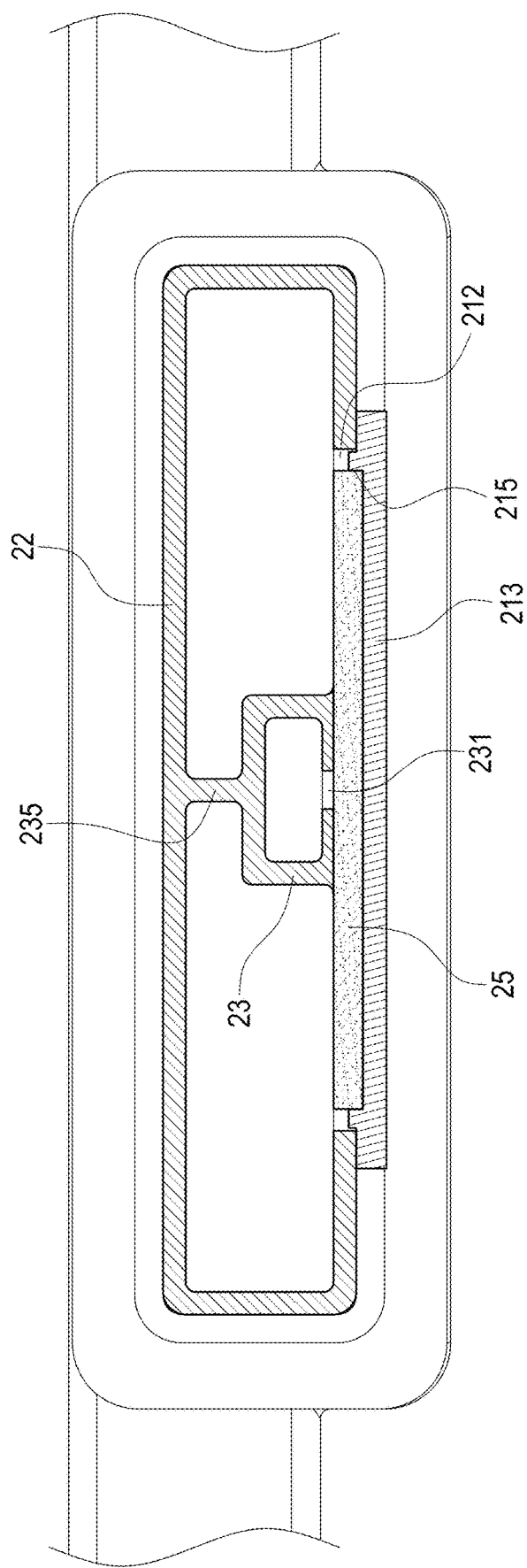
FIG. 7 is a cross-sectional view of the evaporator of the first embodiment of the present invention.
Figure 8C:
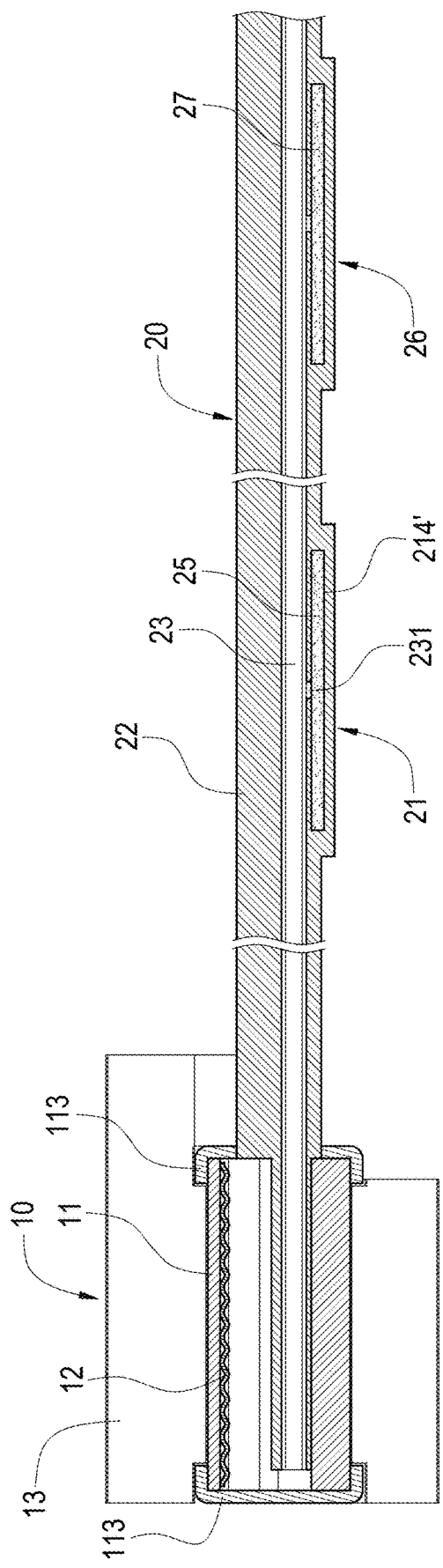
FIG. 8C is a schematic diagram of the protrusion of the evaporating section of the first embodiment of the present invention.

As shown in FIG. 7, a rib 235 is extended between an inner surface of the gas conduit 22 and an outer surface of the liquid conduit 23. Thus, the gas conduit 22 and the liquid conduit 23 can be formed as a single piece by aluminum extruding process.

Please also refer to FIG. 8A and FIG. 8B. When the heat-dissipating device 1 of the present invention is in use, the liquid 24 in the liquid conduit 23 flows into the evaporating section 21 through the hole 231 of the liquid conduit 23. Meanwhile, the heat of the heating element 9 will be conducted to the auxiliary capillary wick 25 through the cover 213. The heat can be transferred to the liquid 24 by the auxiliary capillary wick 25 that enlarges the contacting areas with the liquid 24 in the gas cavity 211. When the liquid 24 absorbs the heat of the auxiliary capillary wick 25 and transforms into the gas 241, the gas 241 will flow in the chamber 111 of the shell 11 through the gas conduit 22.

After the main capillary wick 12 absorbing the heat of the gas 241 in the chamber 111, the heat can be transferred to the shell 11 through the main capillary wick 12, and the shell 11 will conduct the heat to the heat-dissipating body 13. The heat accumulated in the heat-dissipating body 13 will be dissipated to air through heat exchanging with air by the heat-dissipating fins 131. The gas 241 in the chamber 111 will transform into the liquid 24 and flow into the liquid conduit 23 for next cooling circulation. Thus an effect of cooling heating element will be achieved.

A flowing path between the liquid 24 and the gas 241 can be decreased by disposing the liquid conduit 23 in the gas conduit 22. The liquid 24 flowing in the liquid conduit 23 with a smaller cross section has a low pressure. The gas 241 flowing in the gas conduit 22 with a larger cross section has a high pressure. Therefore, the liquid 24 and the gas 241 will achieve a flowing diversion effect. The liquid 24 can be avoided from an affection of the gas 241 when reflowing into the evaporating section 21 so as to reduce the flowing resistance of the liquid 24 and the gas 241. The circulation speed of the liquid 24 and the gas 241 will be raised for a better heat dissipating effect of the heat-dissipating device.

In addition, effects of reducing the volume and simplifying the manufacturing process and the assembly procedure can be achieved by the heat-dissipating bodies 13 connected with the shell 11 in an upper end or a lower end and the liquid conduit 23 inserted in the gas conduit 22. Thereby, the cost of the manufacturing and the material will be reduced.

In this embodiment, the lid 213 of the evaporating section 21 has a protrusion 214 at a side away from the gas cavity 211, and the protrusion 214 is in thermal contact with the heating element. Besides, the opening 212 of the evaporating section 21 and the lid 213 can be omitted by protruding the wall of the evaporating section 21. In other words, the lid 213 can be removed and a protrusion 214' can be formed with the evaporating section 21 as a single piece shown in FIG. 8C.

Figure 9:
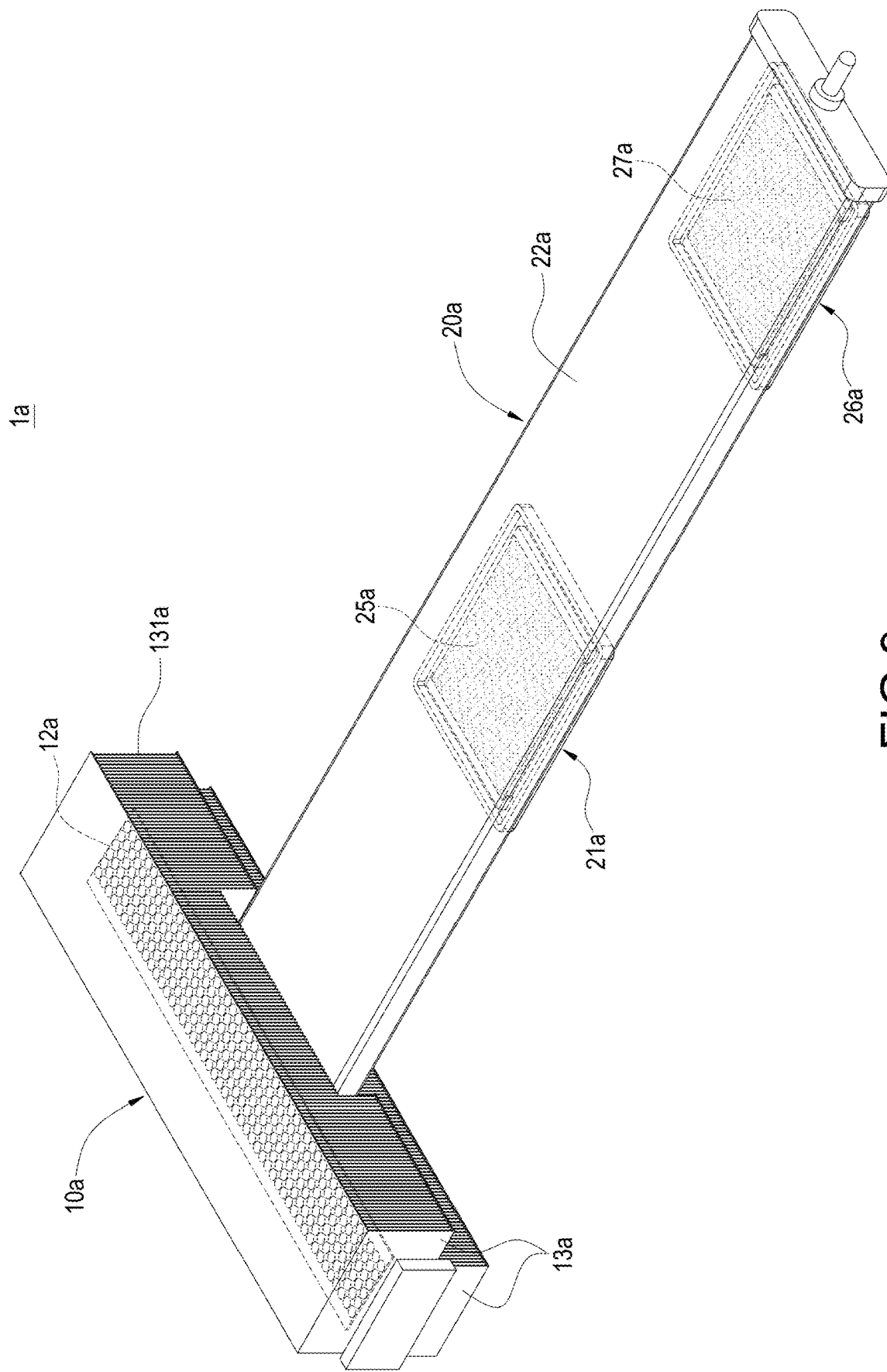
FIG. 9 is a perspective view of the second embodiment of the heat-dissipating device of the present invention.
Figure 10:
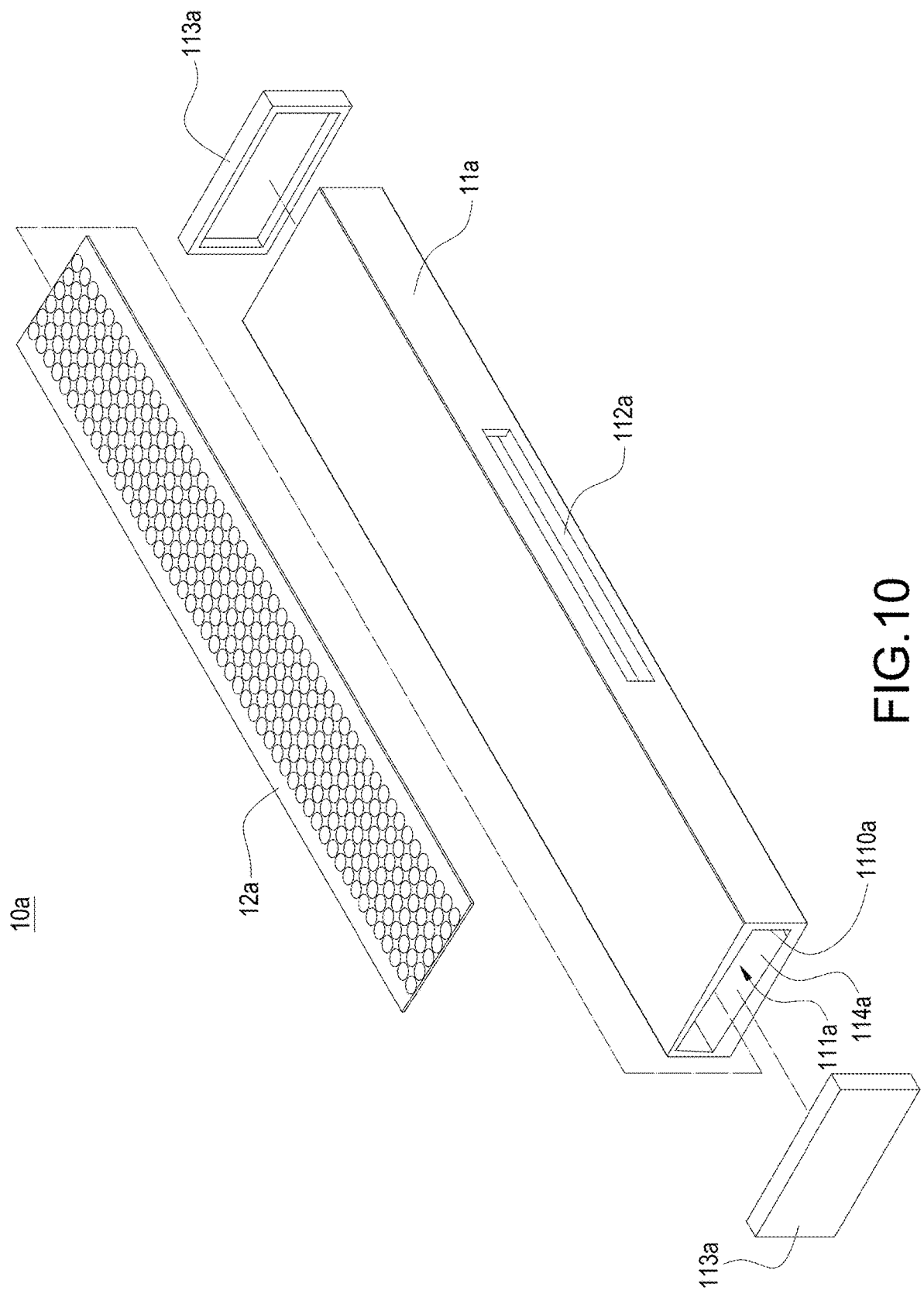
FIG. 10 is an exploded view of the condenser of the second embodiment of the present invention as shown in FIG. 9.
Figure 11:
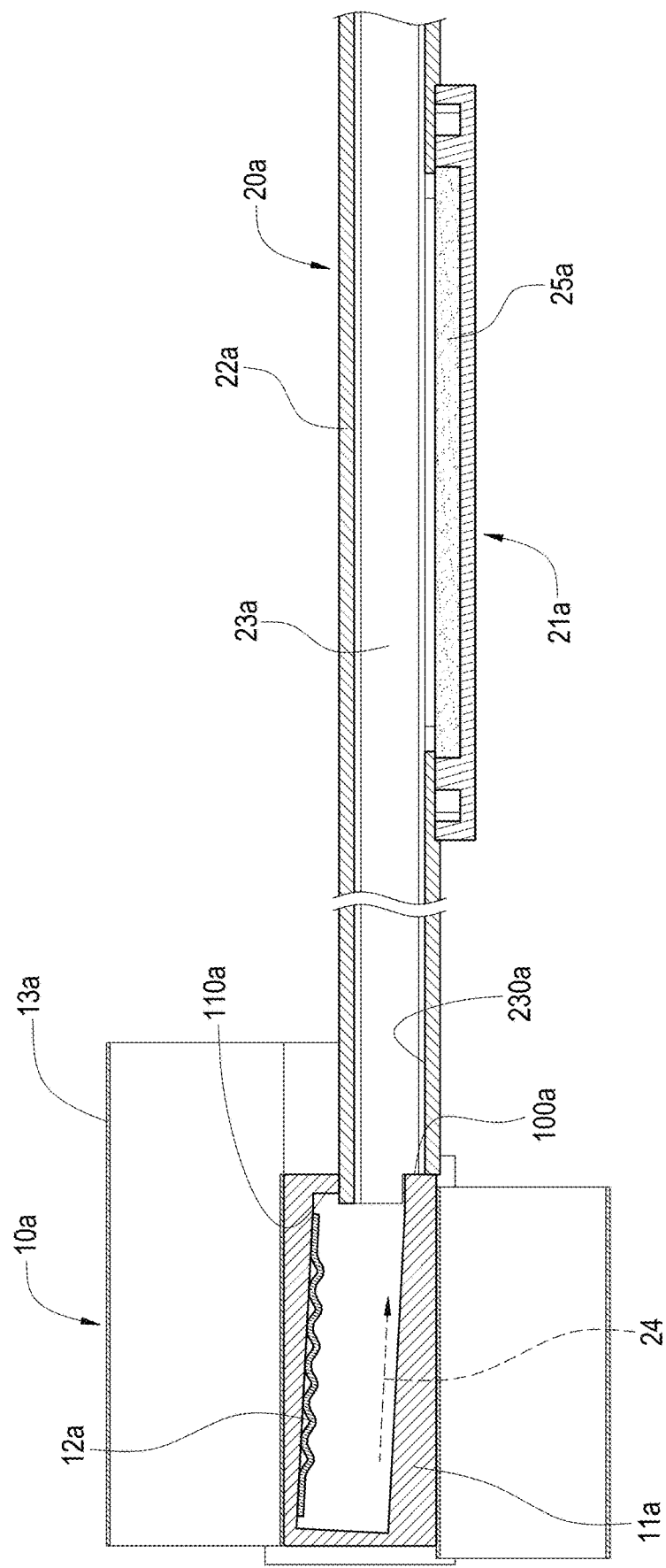
FIG. 11 is a cross-sectional view of the second embodiment of the heat-dissipating device of the present invention.
Figure 14:
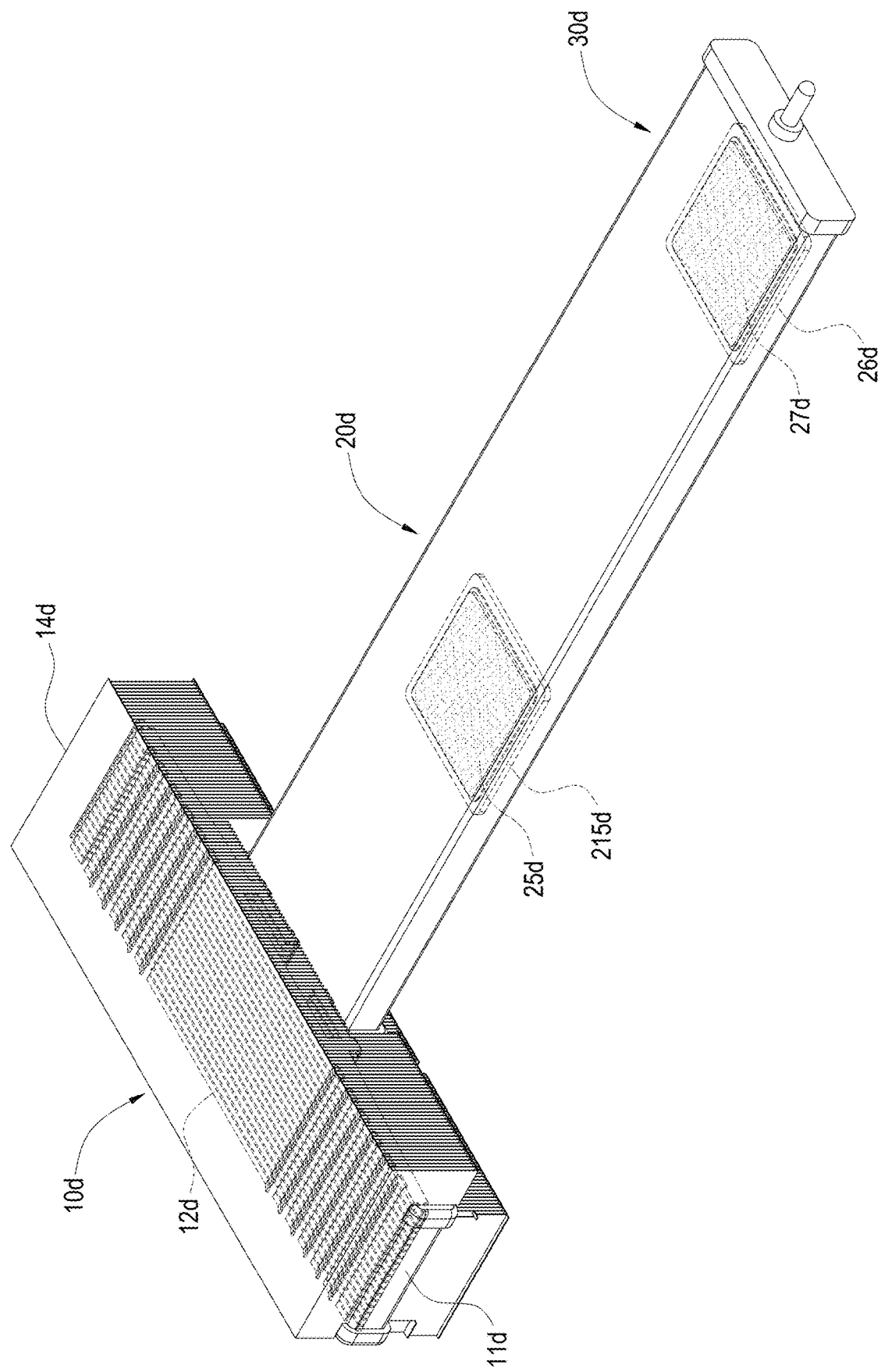
FIG. 14 is a perspective view of the third embodiment of the heat-dissipating device of the present invention.

Please refer to FIG. 9 to FIG. 11 showing the second embodiment of the heat-dissipating device of the present invention. The heat-dissipating device 1a includes a condenser 10a and an evaporator 20a. The condenser 10a includes a shell 11a, a main capillary wick 12a and a heat-dissipating body 13a. The shell 11a has a chamber 111a and a through hole 112a. The evaporator 20a includes an evaporating section 21a, a gas conduit 22a, a liquid conduit 23a, a working fluid and an auxiliary capillary wick 25a.

A difference between the present embodiment and the first embodiment is that the condenser 10a in the present embodiment further includes a couple of lids 113a. A couple of entrances 110a communicating with the chamber 111a are disposed at the left end and right end of the shell 11a. Each lid 113a covers and seals the entrance 110a of the shell 11a. The shell 11a can be formed by extruding for simplifying the manufacturing process and saving the cost of the shell 11a.

Moreover, another difference between the present embodiment and the first embodiment is that an inclined plane 114a is formed at the bottom of the chamber 111a of the shell 11a at a side away from the through hole 112a and tilted toward the through hole 112a. A top plane of the chamber 11a is, preferably but not limited to, parallel to the inclined plane 114a. The wall of the shell 11a has an unequal thickness preferably. When the gas in the condenser 10a is cooled and transformed into the liquid, the liquid can flow quickly along the inclined plane 114a of the chamber 111a into the liquid conduit 23a by the gravity. Thus, the cooling circulation of the heat-dissipating device 1a will be enhanced for improving the cooling effect thereof.

As shown in FIG. 11, a further difference between this embodiment and the first embodiment is that one end of the liquid conduit 23a in this embodiment is located in the through hole 112a. The stepped area is formed between an inner surface 1110a of the chamber 111a and an inner surface 230a of the liquid conduit 23a.

Please further refer to FIG. 12 showing another type of the condenser of the first and second embodiments. The condenser 10b includes a shell 11b, a main capillary wick 12b and a heat-dissipating body (not shown). A difference between the present embodiment with the first embodiment and the second embodiment is that the shell 11b is in one-piece form by bending a metal plate.

The shell 11b has a chamber 111b, and a stepped area 100b is provided at the bottom of the center of the chamber 111b. The main capillary wick 12b can be a metal net or disposed on an inner surface of the chamber 111b by sintering of metal powder or sand blasting. Moreover, it can also be constituted by a foam material. Moreover, two sides of the bottom of the chamber 111b of the shell 11b are formed with an inclined plane 114b tilted from two sides of the shell 11b toward the center of the bottom respectively. The inclined plane 114b is formed by bending the shell 11b directly.

Please further refer to FIG. 13 showing another type of the condenser of the first and second embodiments. The structures of the present embodiment are substantially the same as the above-described embodiments. The condenser 10c includes a shell 11c, a main capillary wick 12c and a heat-dissipating body (not shown), wherein the shell 11c is in one-piece form by bending a metal plate. A difference between this embodiment and the above-described embodiments is that two sides of the bottom of the chamber 111c of the shell 11c are formed with an inclined plane 114c extended and tilted from two sides of the shell 11c toward the center of the bottom respectively, and a stepped area 100c is provided at the bottom of the center of the chamber 111c. The inclined plane 114c is configured by disposing two oblique plates 13c at two sides of the chamber 111c of the shell 11c and neighboring the stepped area 100c, respectively.

Figure 15:
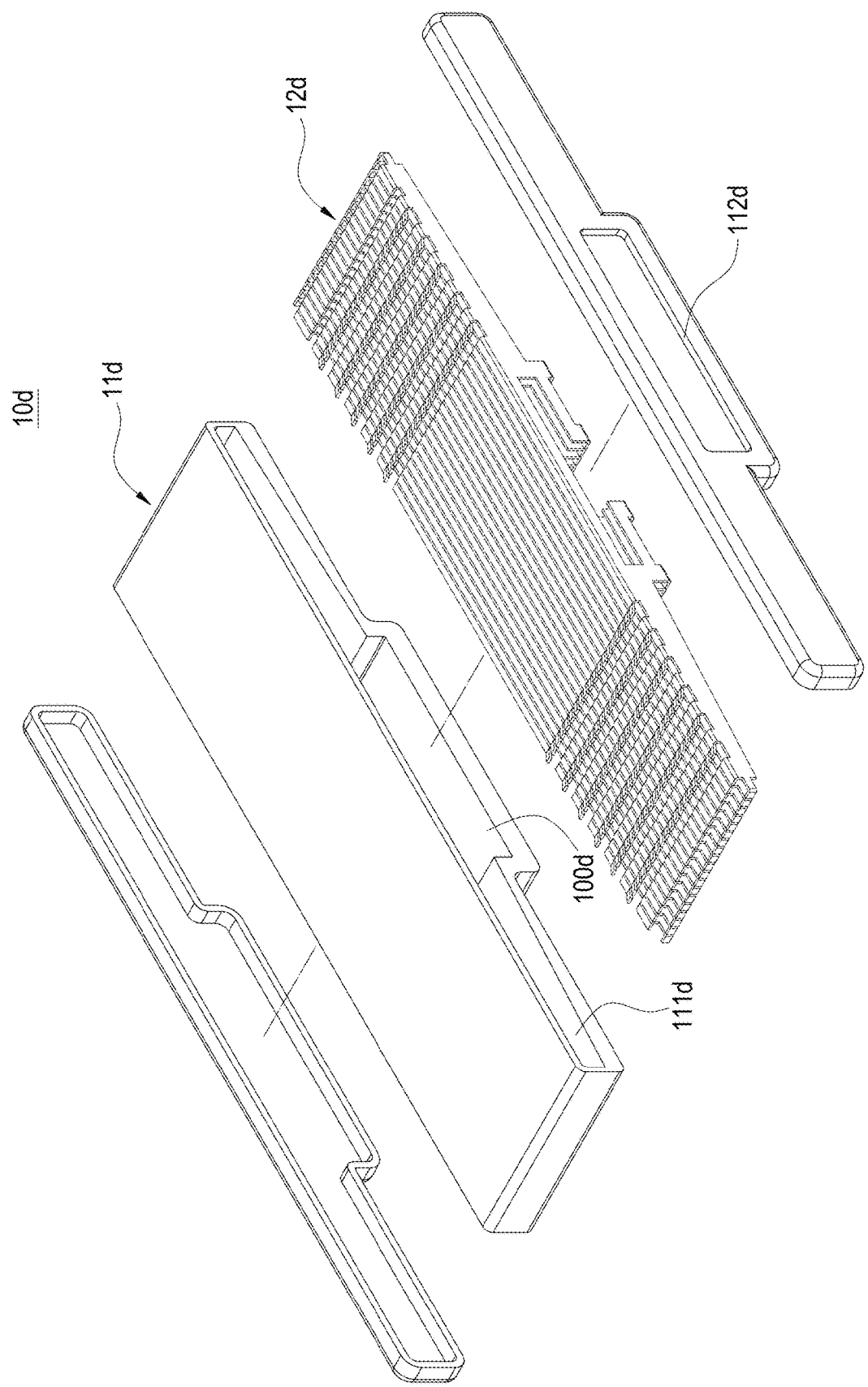
FIG. 15 is an exploded view of the condenser of the third embodiment of the heat-dissipating device of the present invention as shown in FIG. 15.
Figure 16:
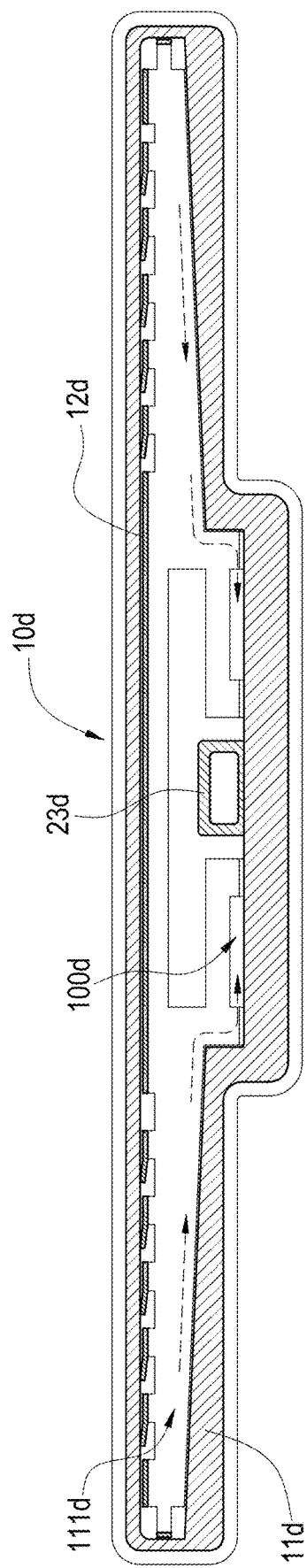
FIG. 16 is a cross-sectional view of the condenser of the third embodiment of the present invention.

Please also refer to FIG. 14 to FIG. 17 showing the third embodiment of the heat-dissipating device of the present invention. The condenser 10d includes a shell 11d and a main capillary wick 12d. The shell 11d has a chamber 111d and a through hole 112d communicating with the chamber 111d at a side of the shell 11d. The main capillary wick 12d is disposed in the chamber 111d. As shown in FIG. 15 and FIG. 16, the main capillary wick 12d includes a plurality of fins protruded from a top inner surface of the chamber 111d to the bottom of an inner surface of the chamber 111d.

Figure 17:
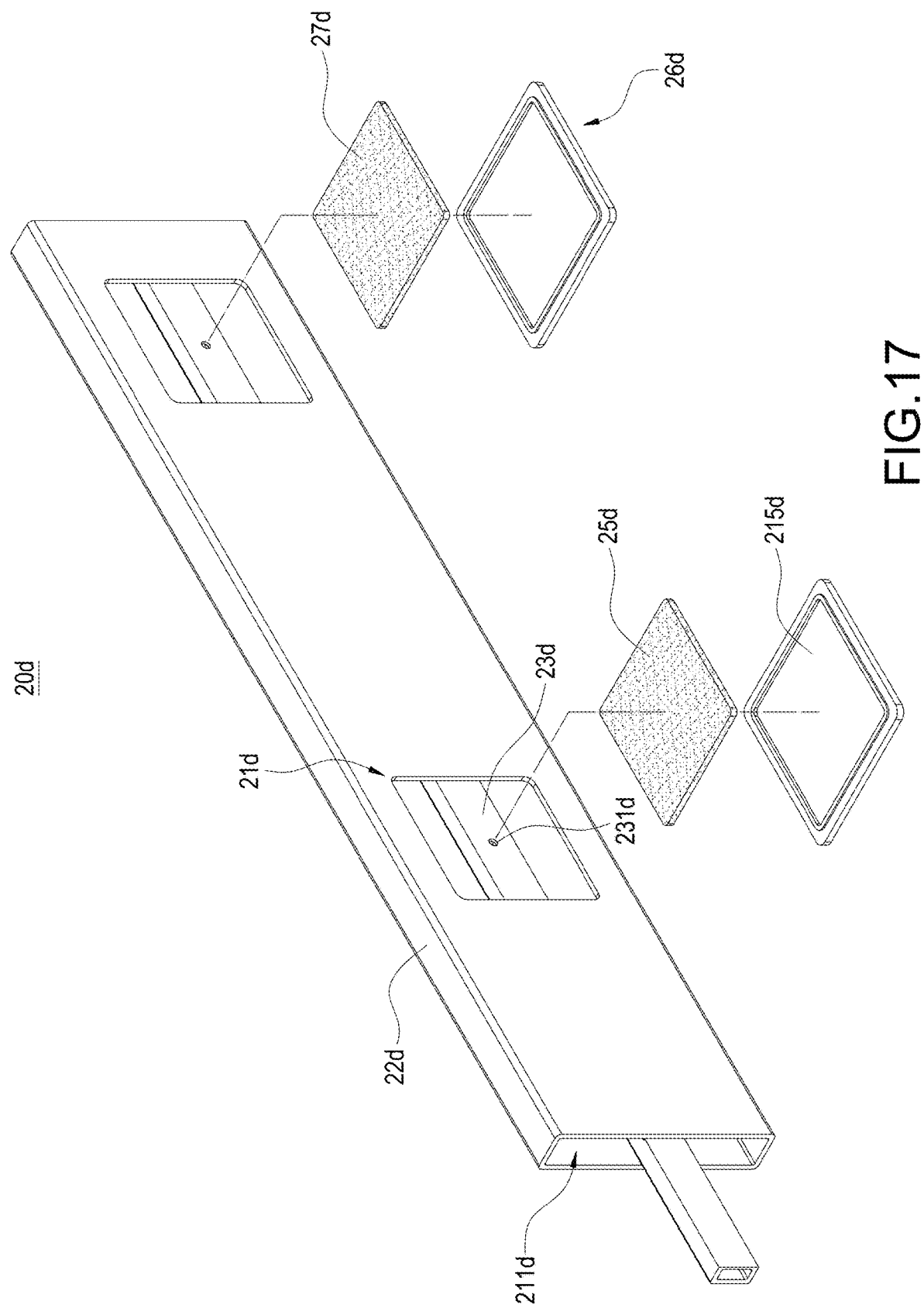
FIG. 17 is an exploded view of the evaporator of the third embodiment of the present invention.

As shown in FIG. 17, the evaporator 20d includes an evaporating section 21d with a gas cavity 211d, a gas conduit 22d communicating with the through hole 112d, and a liquid conduit 23d communicating with the chamber 111d and filling with liquid. The liquid conduit 23d is inserted in the gas conduit 22d and has a hole 231d communicating with the gas cavity 211d. An outer surface of the evaporating section 21d is contacted with the heating element.

Moreover, a location where the liquid conduit 23d inserted in the chamber 111d is formed with a stepped area 100d. The liquid flows into the gas cavity 211d through the hole 231d, and the liquid transforms into gas by absorbing the heat of the heating element through the evaporating section 21d. The gas flows into the chamber 111d through the gas conduit 22d and is transformed into liquid through the condenser 10d for gathering in the stepped area 100d and flowing into the liquid conduit 23d.

In this embodiment, the stepped area 100d is formed in an inner surface of the chamber 111d and located at the bottom of the main capillary wick 12d correspondingly. The liquid conduit 23d is disposed on the stepped area 100d. The stepped area 100d is located at the bottom of the center of the chamber 111d for gathering the liquid in the chamber 111d.

Figure 18:
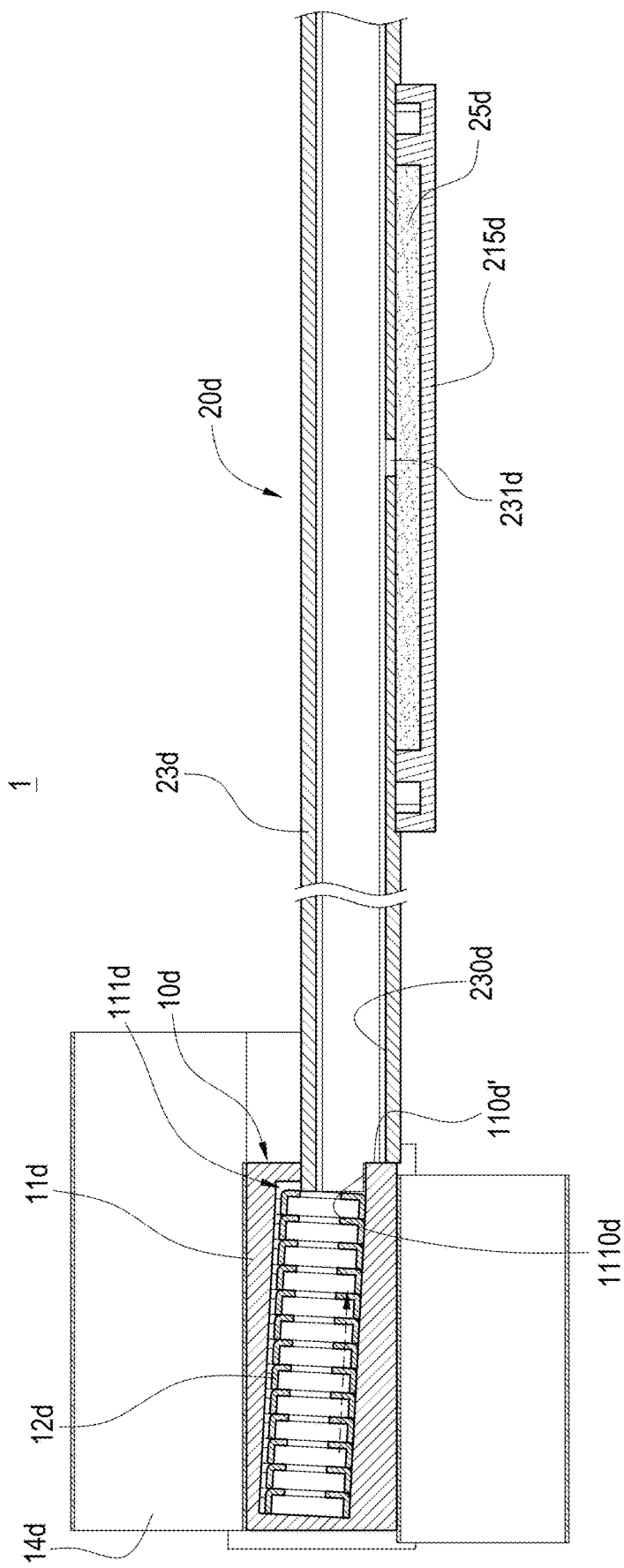
FIG. 18 is a cross-sectional view of the third embodiment of the present invention.

Please refer to FIG. 18 showing the cross-sectional view of the heat-dissipating device of the present invention. A difference between the present embodiment and the first embodiment is that an end of liquid conduit 23d in the present embodiment is located in the through hole 112d. The stepped area 100d' is formed between an inner surface 1110d of the chamber 111d and an inner surface 230d of the liquid conduit 23d.

It is worth notice that the structures of evaporator and condenser in various types can be applied in different embodiments of the heat-dissipating device of the present invention as needed.

In conclusion, the gas flow and the gas flow are disposed in the same component of the heat-dissipating device of the present invention for reducing the module volume and the total cost. Besides, the liquid conduit of the heat-dissipating device of the present invention is assembled with the chamber to form a stepped area. Thus, the liquid after cooling can reflow to the middle zone of the condenser easily by the gravity. A storage can be made for storing the liquid. Therefore, the evaporated liquid due to heat absorption in the evaporator end can be rapidly supplemented for enhancing the heat transfer efficiency.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A heat-dissipating device for contacting with a heating element, comprising:
    a condenser comprising a shell having a chamber and a through hole communicating with the chamber, and a main capillary wick disposed in an inner surface of the chamber; and
    an evaporator comprising an evaporating section having a gas cavity, a gas pipe communicating with the through hole, a liquid pipe having an end communicating with the chamber and filling with liquid, wherein the liquid pipe is inserted in the gas pipe and extends with the gas pipe in an axial direction, the liquid pipe has a hole on a side facing the heating element for communicating with the gas cavity in a direction perpendicular to the axial direction, an outer surface of the evaporating section is contacted with the heating element, a side of the liquid pipe is connected with an inner surface of the gas pipe, the end of the liquid pipe communicating with the chamber is positioned in the through hole,
    wherein the condenser and the evaporator are configured such that the liquid flows into the gas cavity and absorbs the heat generated from the heating element to be transformed into gas, the gas flows into the chamber through the gas pipe, the gas is transformed into the liquid,
    wherein the evaporating section further includes an auxiliary capillary wick, the auxiliary capillary wick and the main capillary wick are disposed separately without contacting, and the evaporator is configured such that the liquid flows through the hole and is absorbed by the auxiliary capillary wick and diffused therein, and then the liquid will be evaporated and flows in the gas pipe, and
    wherein the main capillary wick and the auxiliary capillary wick are located on opposite sides of the liquid pipe, the main capillary wick is disposed above the liquid pipe and free from contacting the liquid pipe, and the auxiliary capillary wick is disposed below the liquid pipe and covers the hole of the liquid pipe.

2. The heat-dissipating device according to claim 1, wherein the evaporator further comprises an auxiliary evaporating section at a side of the evaporating section away from the condenser, the evaporating section and the auxiliary evaporating section are arranged in a line or disposed in a staggered manner, and the gas pipe and the liquid pipe are extended to the auxiliary evaporating section.

3. The heat-dissipating device according to claim 2, wherein the evaporating section has an opening and a cover corresponding to the opening, the opening is communicated with the gas cavity, the cover has a protrusion at a side away from the opening, and the protrusion is contacted with the heating element.

4. The heat-dissipating device according to claim 3, wherein the cover is formed with an embedding slot at a side near the gas cavity, the auxiliary capillary wick comprises a plurality of heat-dissipating fins, a metal net disposed in the embedding slot, a component made of foam, or the cover is formed in the embedding slot of the cover by sand blasting.

5. The heat-dissipating device according to claim 1, wherein a protrusion is protruded from a wall of the evaporating section and formed with the evaporating section as a single piece.

6. The heat-dissipating device according to claim 1, wherein a cross section of the gas pipe is greater than a cross section of the liquid pipe.

7. The heat-dissipating device according to claim 1, wherein the condenser further comprises a lid, an entrance communicating with the chamber and disposed at a side of the shell, and the entrance is sealed by the lid.

8. The heat-dissipating device according to claim 1, wherein a rib is extended between an inner surface of the gas pipe and an outer surface of the liquid pipe.

9. The heat-dissipating device according to claim 1, wherein the condenser further comprises a heat-dissipating body disposed at an upper end or a lower end of the shell.

10. The heat-dissipating device according to claim 9, wherein the heat-dissipating body comprises a plurality of heat-dissipating fins arranged at intervals.

11. The heat-dissipating device according to claim 1, wherein the main capillary wick is a metal net or comprises a plurality of heat-dissipating fins disposed on an inner the inner surface of the chamber.

12. The heat-dissipating device according to claim 1, wherein the main capillary wick is configured in a waved shape.

13. The heat-dissipating device according to claim 1, wherein a U-shaped stepped area is formed between the inner surface of the chamber and an inner surface of the liquid pipe.

14. The heat-dissipating device according to claim 13, wherein the U-shaped stepped area is formed in an inner the inner surface of the chamber and correspondingly located on a bottom of the main capillary wick.

15. The heat-dissipating device according to claim 14, wherein the U-shaped stepped area is located at the bottom of the center of the chamber and formed as a storage space in the chamber.

16. The heat-dissipating device according to claim 1, wherein
the condenser has a length extending in a first direction and a width extending in a second direction different from the first direction, the length of the condenser being greater than the width of the condenser;
the evaporator has a length extending in the second direction and a width extending in the first direction, the length of the evaporator being greater than the width of the evaporator.

17. The heat-dissipating device according to claim 13, wherein the liquid is gathered in the U-shaped stepped area by cooling of the condenser, and the liquid reflows into the liquid pipe through the U-shaped stepped area.

18. The heat-dissipating device according to claim 1, wherein there is a distance between the through hole and the auxiliary capillary wick, and the liquid pipe and gas pipe are not communicated in the distance.

* * * * *

UNITED STATES PATENT AND TRADEMARK OFFICE
CERTIFICATE OF CORRECTION

| | |
|---|---|
| PATENT NO. | : 11,486,652 B2 |
| APPLICATION NO. | : 16/513325 |
| DATED | : November 1, 2022 |
| INVENTOR(S) | : Yu-Hung Huang et al. |

It is certified that error appears in the above-identified patent and that said Letters Patent is hereby corrected as shown below:

On the Title Page

Insert:
--(30) Foreign Application Priority Data
Nov. 12 2013 (CN)............................201310560527.5--

Signed and Sealed this
Seventh Day of February, 2023

Katherine Kelly Vidal
*Director of the United States Patent and Trademark Office*